(12) United States Patent
Oswald et al.

(10) Patent No.: US 10,056,068 B2
(45) Date of Patent: Aug. 21, 2018

(54) AUDIO SYSTEMS FOR PROVIDING ISOLATED LISTENING ZONES

(71) Applicant: Bose Corporation, Framingham, MA (US)

(72) Inventors: Charles Oswald, Salem, NY (US); Eduardo T. Salvador, Cambridge, MA (US); Jeffery R. Vautin, Worcester, MA (US); Michael S. Dublin, Arlington, MA (US); Daniel Ross Tengelsen, Framingham, MA (US); Christopher B. Ickler, Sudbury, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 15/812,371

(22) Filed: Nov. 14, 2017

(65) Prior Publication Data

US 2018/0122355 A1    May 3, 2018

Related U.S. Application Data

(62) Division of application No. 14/828,991, filed on Aug. 18, 2015, now Pat. No. 9,847,081.

(51) Int. Cl.
| | |
|---|---|
| *G10K 11/178* | (2006.01) |
| *H03G 3/20* | (2006.01) |
| *H03G 5/16* | (2006.01) |
| *H04S 7/00* | (2006.01) |
| *H04S 3/00* | (2006.01) |

(52) U.S. Cl.
CPC ............. *G10K 11/178* (2013.01); *H03G 3/20* (2013.01); *H03G 5/165* (2013.01); *H04S 3/008* (2013.01); *H04S 7/302* (2013.01); *H04R 2499/13* (2013.01)

(58) Field of Classification Search
CPC ........ G10K 11/178; H03G 3/20; H03G 5/165; H04S 3/008; H04S 7/302; H04R 2499/13
See application file for complete search history.

(56) References Cited

U.S. PATENT DOCUMENTS

| | | | |
|---|---|---|---|
| 2008/0273714 A1* | 11/2008 | Hartung | H04R 5/02 381/86 |
| 2014/0348354 A1* | 11/2014 | Christoph | H04R 29/001 381/303 |

\* cited by examiner

*Primary Examiner* — Mark Fischer

(57) ABSTRACT

An audio system includes a plurality of near-field speakers arranged in a listening area. A plurality of cross-talk cancellation filters are coupled to the speakers. The speakers and the filters are arranged to provide first and second listening zones in the listening area such that audio from the first listening zone is cancelled in the second listening zone and vice versa. The system also includes at least one audio source providing audio content. Volume-based equalization circuitry receives an audio signal representing audio content for the first listening zone from the audio source and controls a volume adjustment applied to the audio signal to control a volume of audio in the first listening zone. The circuitry limits attenuation or amplification of a first frequency portion of the audio signal when a volume setting differential corresponding to a difference between volume settings for the first and second zones exceeds a predetermined value.

6 Claims, 14 Drawing Sheets

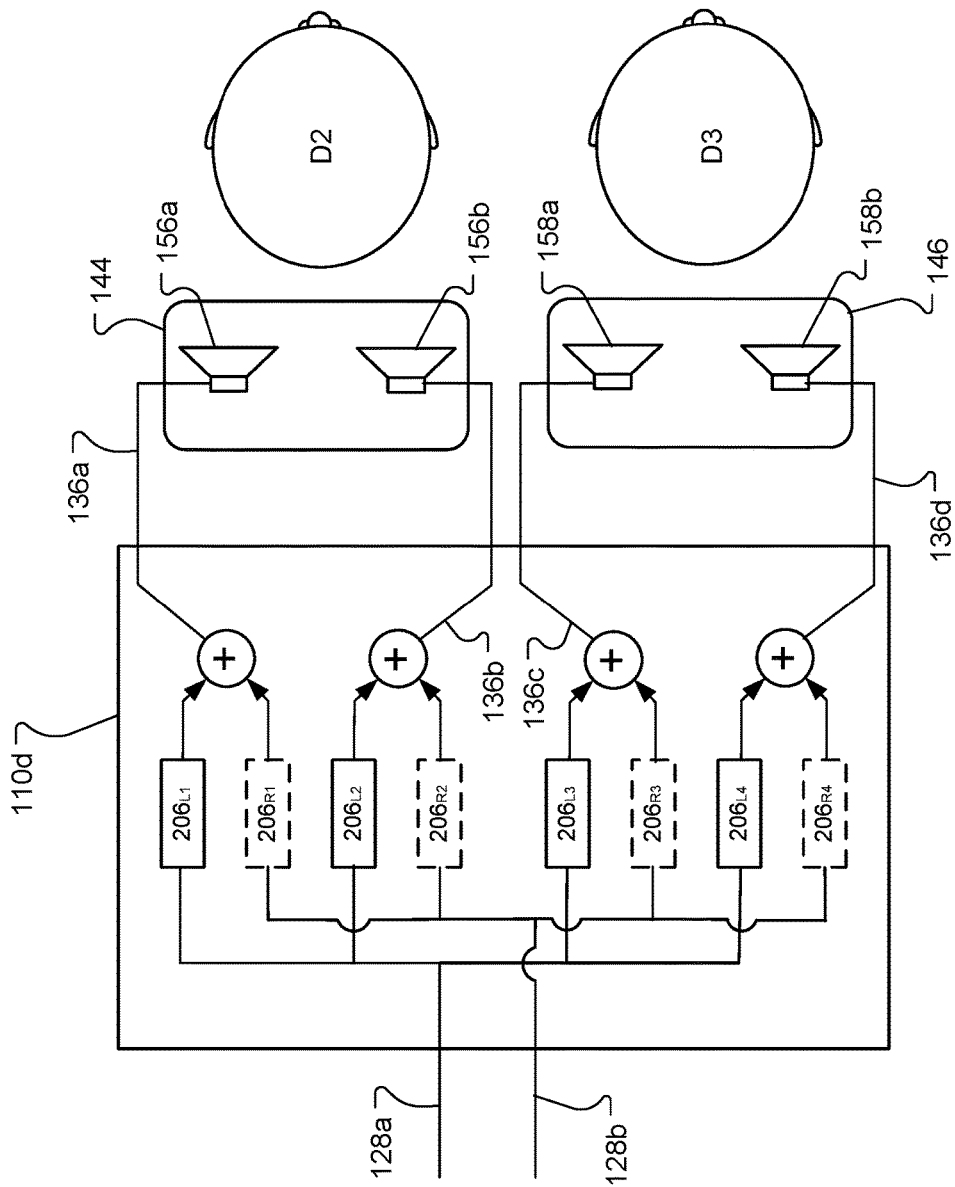

AUDIO SYSTEMS FOR PROVIDING ISOLATED LISTENING ZONES

CROSS-REFERENCE TO RELATED APPLICATIONS

This application is a divisional of U.S. application Ser. No. 14/828,991, filed Aug. 18, 2015, which is incorporated herein by reference in its entirety.

BACKGROUND

This disclosure relates to audio systems for providing isolated listening zones

SUMMARY

All examples and features mentioned below can be combined in any technically possible way.

In one aspect, an audio system includes a plurality of near-field speakers arranged in a listening area. A plurality of cross-talk cancellation filters are coupled to the near-field speakers. The near-field speakers and the cross-talk cancellation filters are arranged to provide first and second listening zones in the listening area such that audio from the first listening zone is cancelled in the second listening zone and vice versa. The audio system also includes at least one audio source for providing audio content. First volume-based equalization circuitry is configured to receive a first audio signal representing audio content for the first listening zone from at least one audio source. The first volume-based equalization circuitry controls a volume adjustment applied to the first audio signal thereby to control a volume of audio in the first listening zone based on a first volume setting. Second volume-based equalization circuitry is configured to receive a second audio signal representing audio content for the second listening zone. The second volume-based equalization circuitry controls a volume adjustment applied to the second audio signal thereby to control a volume of audio in the second listening zone based on a second volume setting. The first volume-based equalization circuitry is configured to limit attenuation or amplification of a first frequency portion of the first audio signal when a volume setting differential corresponding to a difference between the first and second volume settings exceeds a predetermined value.

Implementations may include one of the following features, or any combination thereof.

In some implementations, the second volume-based equalization circuitry is configured to limit attenuation or amplification of a second frequency portion of the second audio signal when the volume setting differential exceeds a predetermined value.

In certain implementations, the first frequency portion and the second frequency portion are the same.

In some cases, the second frequency portion is a low frequency portion, and the second volume-based equalization circuitry is configured to limit attenuation of the low frequency portion of the second audio signal when the volume setting differential exceeds a predetermined value.

In certain cases, the audio system includes control circuitry that is configured to provide the first and second volume-based equalization circuitry with a volume control signal. The first volume-based equalization circuitry is configured to determine the volume setting differential based on information provided in the volume control signal.

In some examples, the first volume-based equalization circuitry only limits the attenuation or amplification of the first frequency portion of the first audio signal based on the volume setting differential when the first and second audio signals represent the same audio content.

In certain examples, the first frequency portion is a low frequency portion, and the first volume-based equalization circuitry is configured to limit attenuation of the low frequency portion of the first audio signal when a volume setting differential corresponding to a difference between the first and second volume settings exceeds a predetermined value.

In another aspect, an audio system includes a plurality of near-field speakers arranged in a listening area, and a plurality of cross-talk cancellation filters coupled to the near-field speakers. The near-field speakers and the cross-talk cancellation filters being arranged to provide first and second listening zones in the listening area in which audio from the first listening zone is cancelled in the second listening zone and vice versa. The audio system also includes a plurality of sensors for detecting occupancy within the listening area. A filter coefficient determination module is configured to select filter coefficients for the cross-talk cancellation filters based on input indicative of the occupancy obtained via the plurality of sensors.

Implementations may include one of the above and/or below features, or any combination thereof.

In some implementations, the audio system also includes a look-up table that stores the filter coefficients, and the filter coefficient determination module selects the filter coefficients from the look-up table.

Another aspect features an audio system that includes a plurality of near-field speakers, and a plurality of cross-talk cancellation filter blocks. The plurality of near-field speakers include first, second, and third sets of near-field speakers. The plurality of cross-talk cancellation filter blocks include first, second, third, and fourth cross-talk cancellation filter blocks. The first cross-talk cancellation filter block includes a first plurality of cross-talk cancellation filters for filtering a first audio signal to provide first filtered audio signals which are transduced by the first set of near-field speakers to present audio content of the first audio signal at one or more seating locations in the first listening zone and to provide inter-aural cross-talk cancellation of left channel and right channel audio content of the first audio signal at the one or more seating locations in the first listening zone. The second cross-talk cancellation filter block includes a second plurality of cross-talk cancellation filters for filtering the first audio signal to provide second filtered audio signals which are transduced by the second set of near-field speakers to cancel audio content of the first audio signal at one or more seating locations in the second listening zone. The third cross-talk cancellation filter block includes a third plurality of cross-talk cancellation filters for filtering a second audio signal to provide third filtered audio signals which are transduced by the first set of near-field speakers to cancel audio content of the second audio signal at the one or more seating locations in the first listening zone. The fourth cross-talk cancellation filter block includes a fourth plurality of cross-talk cancellation filters for filtering the second audio signal to provide fourth filtered audio signals which are transduced by the third set of near-field speakers to present audio content of the second audio signal at the one or more seating locations in the second listening zone and to provide inter-aural cross-talk cancellation of left channel and right channel audio content of the second audio signal at the one or more seating locations in the second listening zone.

Implementations may include one of the above and/or below features, or any combination thereof.

In some implementations, the first and second sets of near-field speakers are mounted in one or more headrests in a first row of seats in the listening area, and the third set of near-field speakers are mounted in one or more headrests in a second row of seats positioned behind the first row of seats in the listening area. The one or more seating locations in the first listening zone are in the first row of seats, and, the one or more seating locations in the second listening zone are in the second row of seats.

BRIEF DESCRIPTION OF THE DRAWINGS

FIGS. 2A-2D are schematic views of cross-talk cancellation filter blocks and associated headrest mounted speakers from the vehicle audio system of FIG. 1.

Figure 1:
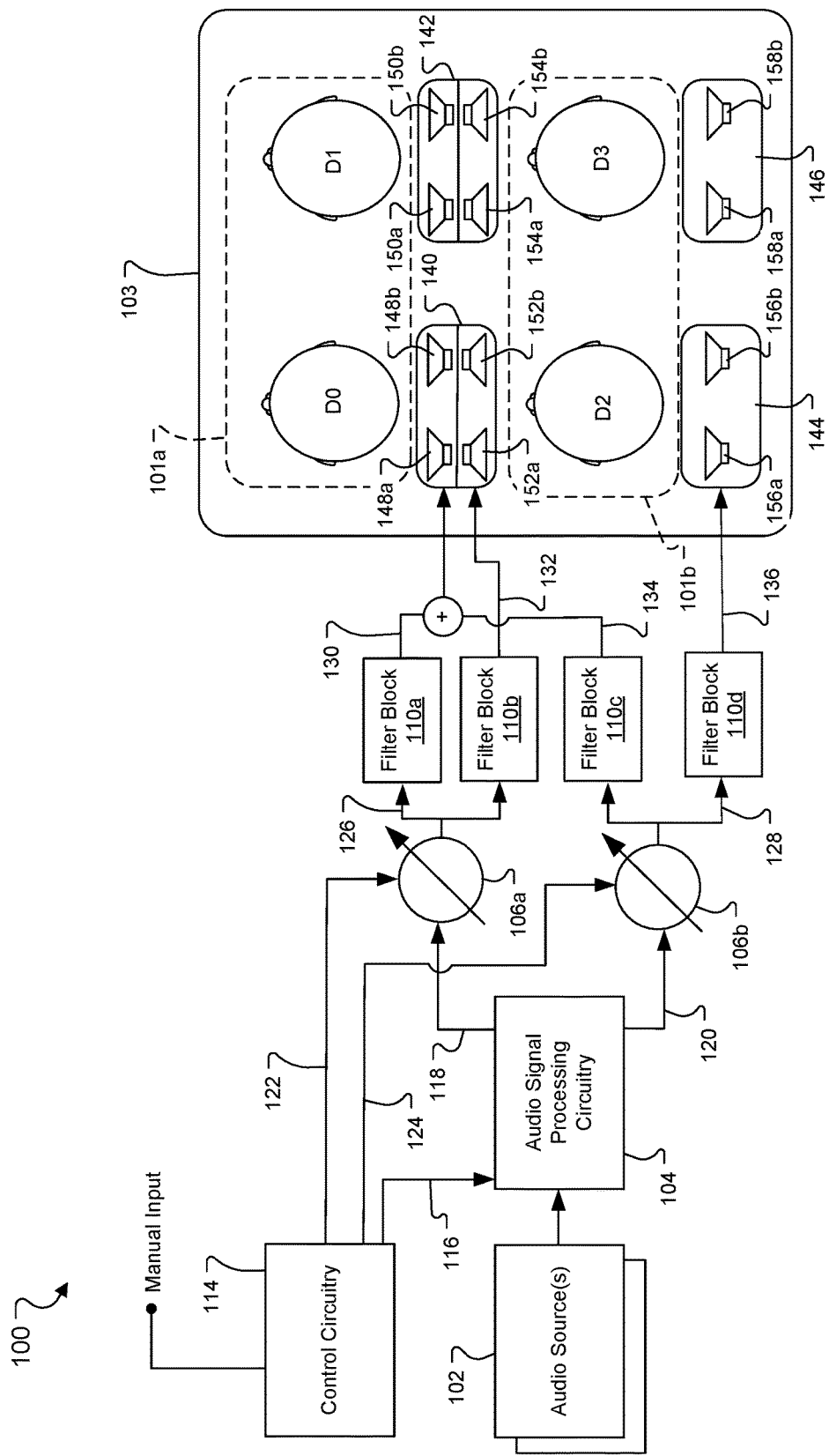
FIG. 1 is a schematic view of an implementation of a vehicle audio system for providing isolated listening zones in a vehicle cabin.

Repeat use of reference characters in the present specification and drawings is intended to represent same or analogous features or elements.

DETAILED DESCRIPTION

Though the elements of several views of the drawings herein may be shown and described as discrete elements in a block diagram and may be referred to as "circuitry," unless otherwise indicated, the elements may be implemented as one of, or a combination of, analog circuitry, digital circuitry, or one or more microprocessors executing software instructions. The software instructions may include digital signal processing (DSP) instructions. Unless otherwise indicated, signal lines may be implemented as discrete analog or digital signal lines, as a single discrete digital signal line with appropriate signal processing to process separate streams of audio signals, or as elements of a wireless communication system. Some of the processing operations may be expressed in terms of the calculation and application of coefficients. The equivalent of calculating and applying coefficients can be performed by other analog or digital signal processing techniques and are included within the scope of this patent application. Unless otherwise indicated, audio signals may be encoded in either digital or analog form; conventional digital-to-analog or analog-to-digital converters may not be shown in the figures. For simplicity of wording, "radiating acoustic energy corresponding to the audio signals" in a given channel or from a given array will be referred to as "radiating" the channel from the array.

Cross-talk cancellation can be utilized in combination with near-field speakers to provide discrete listening zones at different seating positions within a listening area, such as a vehicle cabin. As used herein "near-field speakers" is intended to mean speakers located near a listeners head. FIG. 1 illustrates an exemplary implementation of a vehicle audio system 100 that incorporates a number of cross-talk cancellation filters in combination with a plurality of headrest mounted speakers to provide two discrete (front and rear) listening zones 101a, 101b.

The system 100 includes one or more audio sources 102 which are coupled to audio signal processing circuitry 104. The audio signal processing circuitry 104 is coupled to front and rear volume adjustment circuitry 106a, 106b, respectively. The front and rear volume adjustment circuitry 106a, 106b is coupled to the headrest mounted speakers via cross-talk cancellation filter blocks 110a-d.

In response to control information received from a user through manual input, a control circuit 114 sends a signal 116 to the audio signal processing circuitry 104 selecting a given audio source for the front and rear listening zones 101a, 101b. That is, the signal identifies which audio source is selected for each of the listening zones. Each listening zone can select a different audio source, or a common audio source may be selected for both of the front and rear listening zones 101a, 101b.

The audio signal processing circuitry 104 delivers a first audio signal 118 representing audio content for the front zone 101a to the front volume adjustment circuitry 106a, and delivers a second audio signal 120 representing audio content for the rear zone 101b to the rear volume adjustment circuitry 106b.

In response to volume control information received from a user through manual input, the control circuit sends first and second volume control signals 122, 124 to the front and rear volume adjustment circuitry 106a, 106b, respectively. The front and rear volume adjustment circuitry 106a, 106b adjust the respective amplitudes of the first and second audio signals 118, 120 in response to the volume control signals 122, 124 and provide the amplitude adjusted audio signals 126, 128 to the cross-talk cancellation filter blocks 110a-d. In that regard, the front volume adjustment circuitry 106a controls volume of audio content presented in the front listening zone 101a, and the rear volume adjustment circuitry 106b operates to control the volume of audio content presented in the rear listening zone 101b. Consequently, even when the same audio content is selected for presentation in both zones, the volume level may still differ between the zones.

In the illustrated example, the front volume adjustment circuitry 106a provides a first amplitude adjusted audio signal 126 to first and second cross-talk cancellation filter blocks 110a, 110b, and the rear volume adjustment circuitry 106b provides a second amplitude adjusted audio signal 128 to third and fourth cross-talk cancellation filter blocks 110c, 110d.

Each of the filter blocks 110a-d includes a plurality of cross-talk cancellation filters which may be implemented as least-squares (LS) filters. The filter transfer functions for the cross-talk cancellation filters are determined according to:

$$G = H^{-1} \times T$$

where,

G is a matrix representing the filter transfer functions that we are solving for;

H is a matrix representing the measured acoustic transfer functions, and $H^{-1}$ is the pseudo inversion of that matrix; and T is matrix representing the target that we are trying to achieve. These targets are set to define the desired cross-talk cancellation at the vehicle occupant's heads.

For the example illustrated in FIG. 1, the filter transfer functions for the cross-talk cancellation filters in the first and second filter blocks 110a, 110b are solved for together since those two filter blocks work together to provide cross-talk cancellers at front seating positions and to cancel audio from the front zone at the rear seating positions. Similarly, the filter transfer functions for the cross-talk cancellation filters in the third and fourth filter blocks 110c, 110d are solved for together since those two filter blocks work together to provide cross-talk cancellers in the rear seating positions and to cancel audio from the rear zone at the front seating positions. The cross-talk cancellation filter blocks 110a-d provide respective filtered audio signals 130, 132, 134, 136 to corresponding sets of the headrest mounted speakers which transduce the filtered audio signals 130, 132, 134, 136.

The system 100 includes a pair of front headrests 140, 142 and a pair of rear headrests 144, 146. Each of the front headrests is provided with four electro-acoustic transducers including two forward firing electro-acoustic transducers 148a, 148b, 150a, 150b and two rear firing electro-acoustic transducers 152a, 152b, 154a, 154b. The forward firing speakers 148a, 148b, 150a, 150b of the front headrests 140, 142 provide audible audio content for the occupants in the first, front zone 101a (i.e., the two front seats), while also assisting in enabling inter-aural cross-talk cancellation in each of the two front seats, and inter-seat cross-talk cancellation between the two front seats. The rear firing speakers 152a, 152b, 154a, 154b of the front headrests 144, 146 assist in enabling inter zone cross-talk cancellation between the front and rear zones 101a, 101b.

Each of the rear headrests 144, 146 include two forward firing speakers 156a, 156b, 158a, 158b. The forward firing speakers 156a, 156b, 158a, 158b of the rear headrests 144, 146 provide audible audio content for the occupants in the second, rear zone 101b (i.e., the two rear seats), while also assisting in enabling inter-aural cross-talk cancellation in each of the two rear seats, and inter-seat cross-talk cancellation between the two rear seats.

Figure 2A:
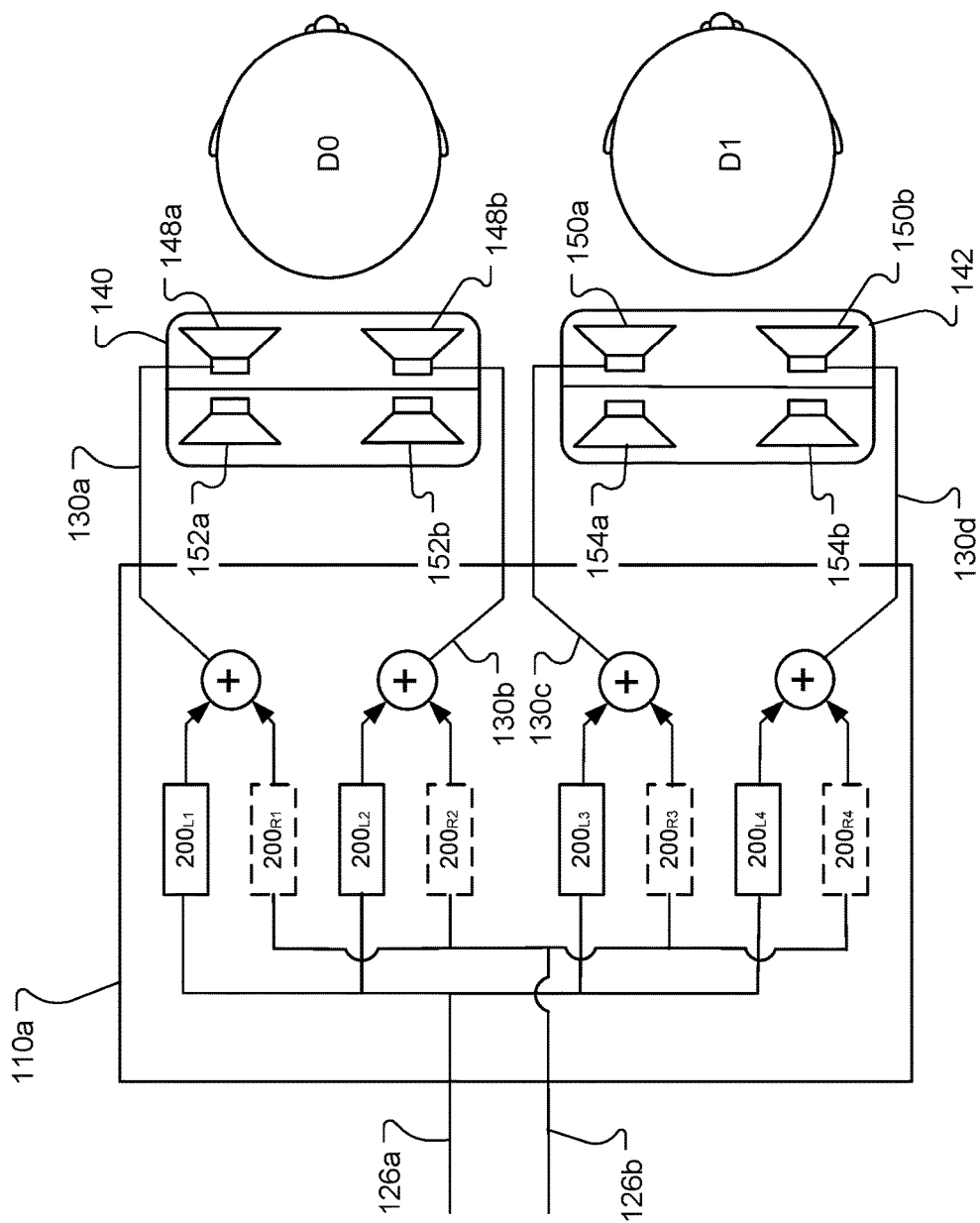

Referring to FIG. 2A, the first cross-talk cancellation filter block 110a includes a plurality of cross-talk cancellation filters (eight shown). The first amplitude adjusted audio signal 126, shown as a stereo audio signal consisting of left and right audio channels 126a, 126b, is passed through the first cross-talk cancellation filter block 110a to produce first filtered audio signals 130a-d (collectively referenced as 130), one for each of the forward firing speakers 148a, 148b, 150a, 150b in the front headrests 140, 142. These filtered audio signals 130 determine the net acoustic energy associated with each acoustic channel in the first audio signal 118 that is provided to the occupants D0, D1 in the front seats.

A left channel filter $200_{L1}$ associated with a forward firing left speaker 148a of the driver's headrest 140 modifies the left channel input signal 126a taking into account the acoustic transfer functions from each of the other front headrest mounted speakers 148b, 150a, 150b, 152a, 152b, 154a, 154b to an expected position of the driver's left ear to produce a first output signal component that is configured to reproduce the left channel acoustic content of the first audio signal at the driver's left ear.

A right channel filter $200_{R1}$ associated with the forward firing left speaker 148a of the driver's headrest 140 modifies the right channel input 126b of the first amplitude adjusted audio signal 126 taking into account the transfer functions from each of the other front headrest mounted speakers 148b, 150a, 150b, 152a, 152b, 154a, 154b to the expected position of the driver's left ear to produce a second output signal component that is configured to cancel the right channel acoustic content of the first audio signal 118 that is leaked to the driver's left ear from the other speakers 148b, 150a, 150b, 152a, 152b, 154a, 154b in the front headrests 140, 142.

The first and second output signal components are combined to produce a filtered audio signal 130a which is provided to the forward firing left speaker 148a in the driver's headrest 140. The remaining cross-talk cancellation filters of the first cross-talk cancellation filter block 110a and the associated speakers 148b, 150a, 150b operate similarly so that the front seat occupants D0, D1 hear only left audio content of the first audio signal 118 at their respective left ears and hear only right audio content of the first audio signal 118 at their respective right ears.

Filters $200_{L2}$ and $200_{R2}$ provide a filtered audio signal 130b to the forward firing right speaker 148b in the driver's headrest 140, which is transduced to reproduce the right channel acoustic content of the first audio signal 118 at the driver's right ear, while cancelling left channel content of the first audio signal 118 leaked by the other front headrest mounted speakers 148a, 150a, 150b, 152a, 152b, 154a, 154b at the driver's right ear.

Filters $200_{L3}$ and $200_{R3}$ provide a filtered audio signal 130c to the forward firing left speaker 150a in the front passenger's headrest 142, which is transduced to reproduce the left channel acoustic content of the first audio signal 118 at the passenger's left ear, while cancelling right channel content of the first audio signal 118 leaked by the other front headrest mounted speakers 148a, 148b, 150b, 152a, 152b, 154a, 154b at the passenger's left ear.

Filters $200_{L4}$ and $200_{R4}$ provide a filtered audio signal 130d to the forward firing right speaker 150b in the front passenger's headrest 142, which is transduced to reproduce the right channel acoustic content of the first audio signal 118 at the passenger's right ear, while cancelling left channel content of the first audio signal 118 leaked by the other front headrest mounted speakers 148a, 148b, 150a, 152a, 152b, 154a, 154b at the passenger's right ear.

Figure 2B:
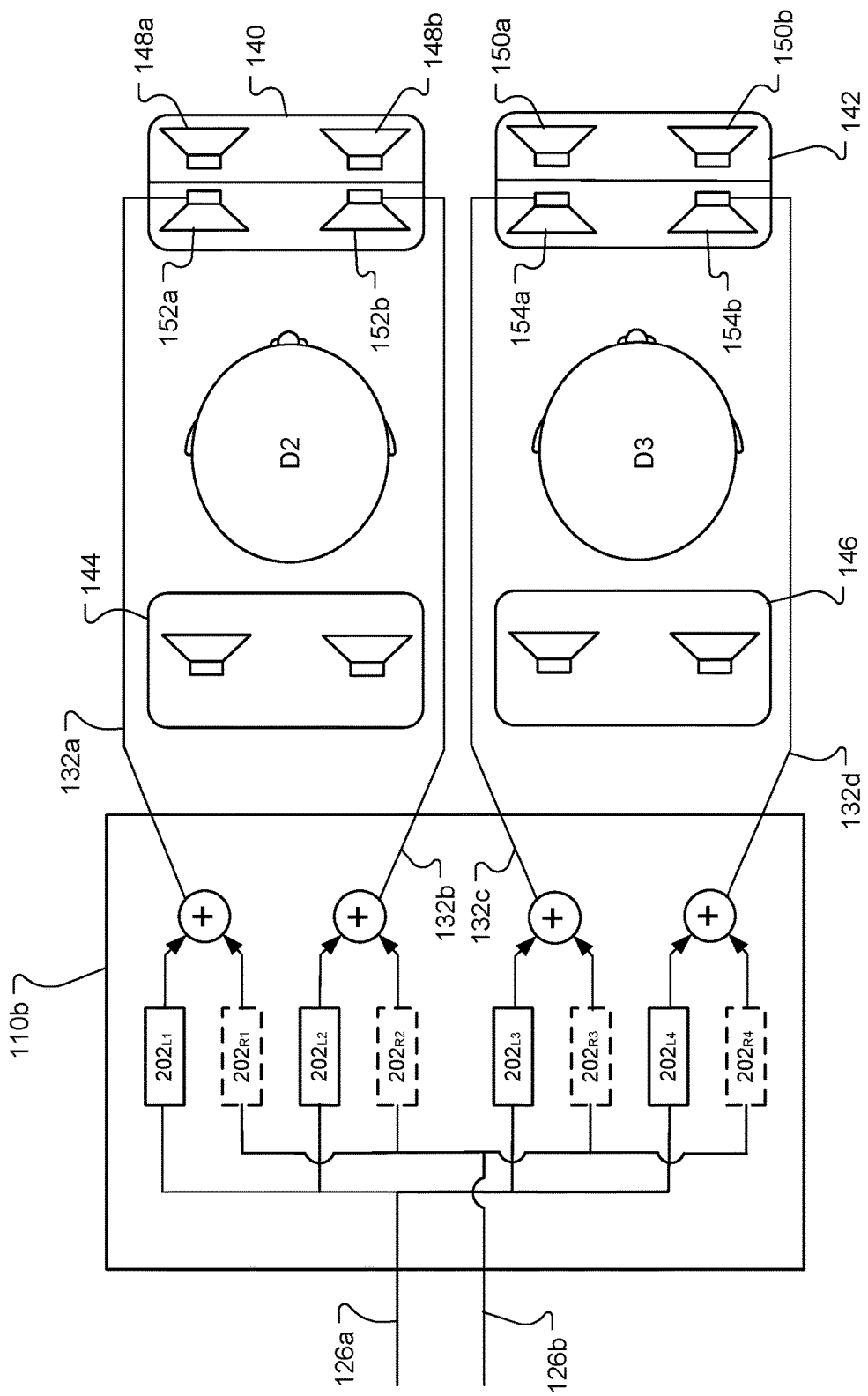

Referring to FIG. 2B, the second cross-talk cancellation filter block 110b includes a plurality of cross-talk cancellation filters (eight shown). The first amplitude adjusted audio signal 126, shown again as a stereo audio signal consisting of left and right audio channels 126a, 126b, is passed through the second cross-talk cancellation filter block 110b to produce second filtered audio signals 132a-d (collectively referenced as 132), one for each of the rear firing speakers 152a, 152b, 154a, 154b in the front headrests 140, 142. These filtered audio signals 132 determine the net acoustic energy associated with each acoustic channel in the first audio signal 118 that is provided to the occupants D2, D3 in the rear seats.

A left channel filter $202_{L1}$ associated with a rear firing left speaker 152a of the driver's headrest 140 modifies the left channel input signal 126a taking into account the acoustic transfer functions from each of the other front headrest mounted speakers 148a, 148b, 150a, 150b, 152b, 154a, 154*b* to an expected position of the rear left passenger's left ear to produce a first output signal component that is configured to cancel the left channel acoustic content of the first audio signal 118 that is leaked to the rear left passenger's left ear from the other front headrest mounted speakers 148*a*, 148*b*, 150*a*, 150*b*, 152*b*, 154*a*, 154*b*.

A right channel filter $202_{R1}$ associated with the rear firing left speaker 152*a* of the driver's headrest modifies the right channel input from first amplitude adjusted audio signal 126*b* taking into account the acoustic transfer functions from each of the other front headrest mounted speakers 148*a*, 148*b*, 150*a*, 150*b*, 152*b*, 154*a*, 154*b* to the expected position of the rear left passenger's left ear to produce a second output signal component that is configured to cancel the right channel acoustic content of the first audio signal 118 that is leaked to the rear left passenger's left ear from the other front headrest mounted speakers 148*a*, 148*b*, 150*a*, 150*b*, 152*b*, 154*a*, 154*b*.

The first and second output signal components are combined to produce a filtered audio signal 132*a* which is provided to the rear firing left speaker 152*a* in the driver's headrest 140. The remaining cross-talk cancellation filters of the second cross-talk cancellation filter block 110*b* and the associated speakers 152*b*, 154*a*, 154*b* operate similarly so that audio content from the first audio signal 118 is cancelled at the seating positions in the rear listening zone 101*b* (FIG. 1).

Filters $202_{L2}$ and $202_{R2}$ provide a filtered audio signal 132*b* to the rear firing right speaker 152*b* in the driver's headrest 140, which is transduced to cancel audio content of the first audio signal 118 leaked by the other front headrest mounted speakers 148*a*, 148*b*, 150*a*, 150*b*, 152*a*, 154*a*, 154*b* at the rear left passenger's right ear.

Filters $202_{L3}$ and $202_{R3}$ provide a filtered audio signal 132*c* to the rear firing left speaker 154*a* in the front passenger's headrest 142, which is transduced to cancel audio content of the first audio signal 118 leaked by the other front headrest mounted speakers 148*a*, 148*b*, 150*a*, 150*b*, 152*a*, 152*b*, 154*b* at the rear right passenger's left ear.

Filters $202_{L4}$ and $202_{R4}$ provide a filtered audio signal 132*d* to the rear firing right speaker 154*b* in the front passenger's headrest 142, which is transduced to cancel audio content of the first audio signal 118 leaked by the other front headrest mounted speakers 148*a*, 148*b*, 150*a*, 150*b*, 152*a*, 152*b*, 154*a* at the rear right passenger's right ear.

Figure 2C:
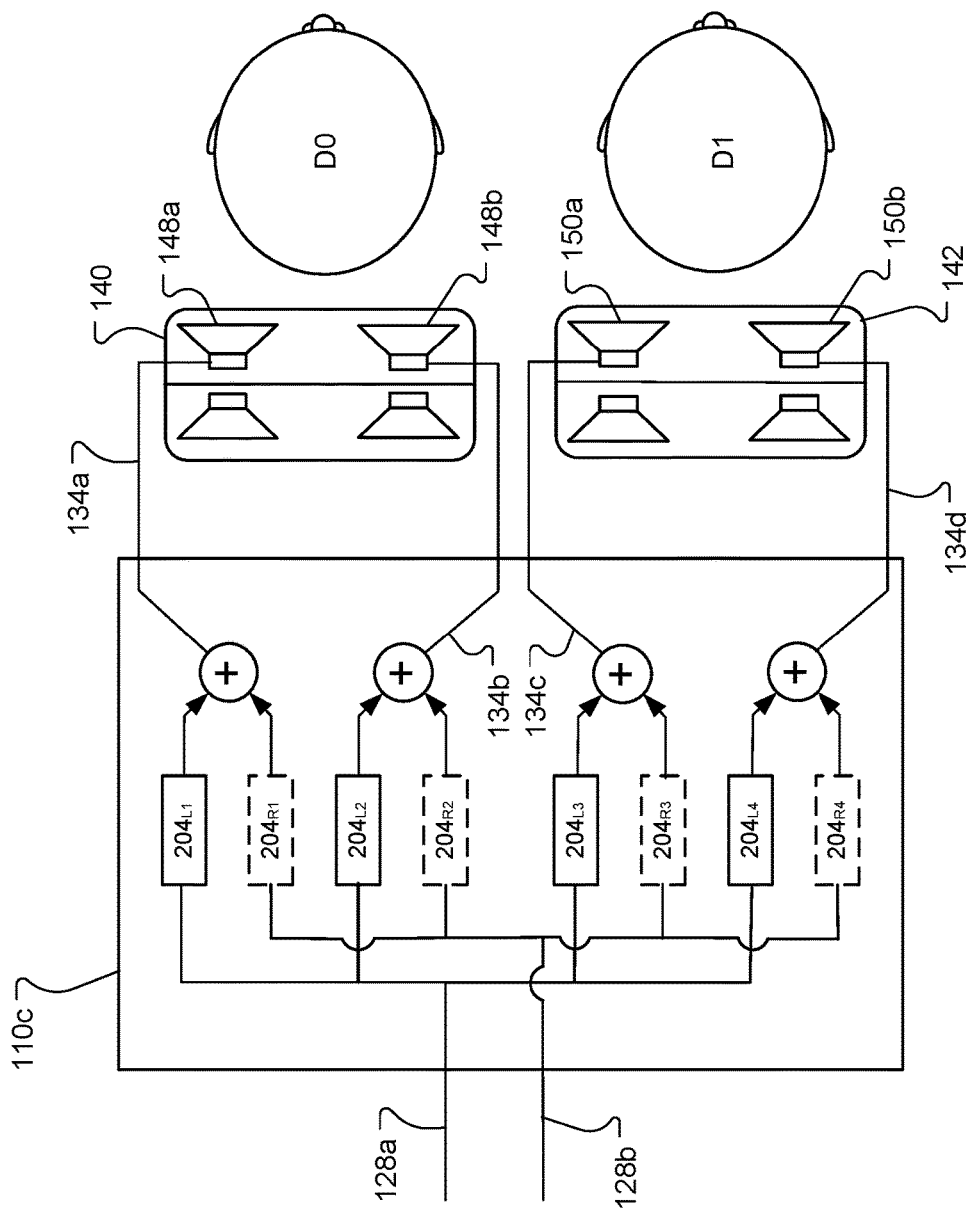

Referring to FIG. 2C, the third cross-talk cancellation filter block 110*c* includes a plurality of cross-talk cancellation filters (eight shown). The second amplitude adjusted audio signal 128, shown as a stereo audio signal consisting of left and right audio channels 128*a*, 128*b*, is passed through the third cross-talk cancellation filter block 110*c* to produce third filtered audio signals 134*a-d* (collectively referenced as 134), one for each of the forward firing speakers 148*a*, 148*b*, 150*a*, 150*b* in the front headrests 140, 142. These filtered audio signals 134 determine the net acoustic energy associated with each acoustic channel in the second audio signal 120 that is provided to the occupants in the front seats.

A left channel filter $204_{L1}$ associated with a forward firing left speaker 148*a* of the driver's headrest 140 modifies the left channel input signal 128*a* taking into account the acoustic transfer functions from each of the rear headrest mounted speakers 156*a*, 156*b*, 158*a*, 158*b* (FIG. 1) and from each of the other forward firing front headrest mounted speakers 148*b*, 150*a*, 150*b* to an expected position of the driver's left ear to produce a first output signal component that is configured to cancel the left channel acoustic content of the second audio signal 120 that is leaked to the driver's left ear from the rear headrest mounted speakers 156*a*, 156*b*, 158*a*, 158*b* and from the other forward firing front headrest mounted speakers 148*b*, 150*a*, 150*b*.

A right channel filter $204_{R1}$ associated with the forward firing left speaker 148*a* of the driver's headrest 140 modifies the right channel input 128*b* from the second amplitude adjusted audio signal 128 taking into account the acoustic transfer functions from each of the rear headrest mounted speakers 156*a*, 156*b*, 158*a*, 158*b* and from each of the other forward firing front headrest mounted speakers 148*b*, 150*a*, 150*b* to the expected position of the driver's left ear to produce a second output signal component that is configured to cancel the right channel acoustic content of the second audio signal 120 that is leaked to the driver's left ear from the rear headrest mount speakers 156*a*, 156*b*, 158*a*, 158*b* and from the other forward firing front headrest mounted speakers 148*b*, 150*a*, 150*b*.

The first and second output signal components are combined to produce a filtered audio signal 134*a* which is provided to the front firing left speaker 148*a* in the driver's headrest 140. The remaining cross-talk cancellation filters of the third cross-talk cancellation filter block 110*c* and the associated speakers 148*b*, 150*a*, 150*b* operate similarly so that audio content from the second audio signal 120 is cancelled at the seating positions in the front listening zone 101*a* (FIG. 1).

Filters $204_{L2}$ and $204_{R2}$ provide a filtered audio signal 134*b* to the front firing right speaker 148*b* in the driver's headrest 140, which is transduced to cancel audio content of the second audio signal 120 leaked by the other front headrest mounted speakers 148*a*, 150*a*, 150*b* and the rear headrest mounted speakers 156*a*, 156*b*, 158*a*, 158*b* at the driver's right ear.

Filters $204_{L3}$ and $204_{R3}$ provide a filtered audio signal 134*c* to the front firing left speaker 150*a* in the front passenger's headrest 142, which is transduced to cancel audio content of the second audio signal 120 leaked by the other front headrest mounted speakers 148*a*, 148*b*, 150*b* and the rear headrest mounted speakers 156*a*, 156*b*, 158*a*, 158*b* at the front passenger's left ear.

Filters $204_{L4}$ and $204_{R4}$ provide a filtered audio signal 134*d* to the front firing right speaker 150*b* in the front passenger's headrest 142, which is transduced to cancel audio content of the second audio signal 120 leaked by the other front headrest mounted speakers 148*a*, 148*b*, 150*a* and the rear headrest mounted speakers 156*a*, 156*b*, 158*a*, 158*b* at the front passenger's right ear.

Referring to FIG. 2D, the fourth cross-talk cancellation filter 110*d* block includes a plurality of cross-talk cancellation filters (eight shown). The second amplitude adjusted audio signal 128, shown again as a stereo audio signal consisting of left and right audio channels 128*a*, 128*b*, is passed through the fourth cross-talk cancellation filter block 110*d* to produce fourth filtered audio signals 136*a-d* (collectively referenced as 136), one for each of the speakers 156*a*, 156*b*, 158*a*, 158*b* in the rear headrests 144, 146. These filtered audio signals 136 determine the net acoustic energy associated with each acoustic channel in the second audio signal 120 that is provided to the occupants in the rear seats.

A left channel filter $206_{L1}$ associated with a left speaker 156*a* of the rear left passenger's headrest 144 modifies the left channel input signal 128*a* taking into account the acoustic transfer functions from each of the other rear headrest mounted speakers 156*b*, 158*a*, 158*b* and the forward firing speakers 148*a*, 148*b*, 150*a*, 150*b* (FIG. 1) of the front headrests 140, 142 (FIG. 1) to an expected position of the rear left passenger's left ear to produce a first output signal component that is configured to reproduce the left channel acoustic content of the second audio signal 120 at the rear left passenger's left ear.

A right channel filter $206_{R1}$ associated with the left speaker 156a of the rear left passenger's headrest 144 modifies the right channel input 128b from second amplitude adjusted audio signal 128 taking into account the acoustic transfer functions from each of the other rear headrest mounted speakers 156b, 158a, 158b and the forward firing speakers 148a, 148b, 150a, 150b of the front headrests 140, 142 to the expected position of the rear left passenger's left ear to produce a second output signal component that is configured to cancel the right channel acoustic content of the second audio signal 120 that is leaked to the rear left passenger's left ear from the other speakers in the rear headrests 156b, 158a, 158b and from the forward firing speakers 148a, 148b, 150a, 150b mounted in the front headrests 140, 142.

The first and second output signal components are combined to produce a filtered audio signal 136a which is provided to the left speaker 156a in the rear left passenger's headrest 144. The remaining cross-talk cancellation filters of the fourth cross-talk cancellation filter block 110d and the associated speakers 156b, 158a, 158b operate similarly so that the rear seat occupants hear only left audio content of the second audio signal 120 at their respective left ears and hear only right audio content of the second audio signal 120 at their respective right ears.

Filters $206_{L2}$ and $206_{R2}$ provide a filtered audio signal 136b to the right speaker 156b in the rear left passenger's headrest 144, which is transduced to reproduce the right channel acoustic content of the second audio signal 120 at the rear left passenger's right ear, while cancelling left channel content of the second audio signal 120 leaked by the forward firing front headrest mounted speakers 148a, 148b, 150a, 150b and the other rear headrest mounted speakers 156b, 158a, 158b at the rear left passenger's right ear.

Filters $206_{L3}$ and $206_{R3}$ provide a filtered audio signal 136c to the left speaker 158a in the rear right passenger's headrest 146, which is transduced to reproduce the left channel acoustic content of the second audio signal 120 at the rear right passenger's left ear, while cancelling right channel content of the second audio signal 120 leaked by the forward firing front headrest mounted speakers 148a, 148b, 150a, 150b and the other rear headrest mounted speakers 156a, 156b, 158b at the rear right passenger's left ear.

Filters $206_{L4}$ and $206_{R4}$ provide a filtered audio signal 136d to the forward firing right speaker 158b in the rear right passenger's headrest 146, which is transduced to reproduce the right channel acoustic content of the second audio signal 120 at the rear right passenger's right ear, while cancelling left channel content of the second audio signal 120 leaked by the forward firing front headrest mounted speakers 148a, 148b, 150a, 150b and the other rear headrest mounted speakers 156a, 156b, 158a at the rear right passenger's right ear.

The above described audio system can allow rear vehicle occupants (a/k/a rear passengers), i.e., occupants in the rear seats, to listen to different audio content than the occupants in the front seats. The system can also allow both sets of occupants (i.e., front and back) to listen to the same audio content at contrasting volumes level. For example, passengers in the back seats may wish to listen to the same audio content as the occupants in the front seat, but at a low volume level.

When the volume difference between zones becomes large (>~6 dB), there may be some spectral coloring in the attenuated zone (i.e., the lower volume zone) because of the relatively poorer isolation at higher frequencies. This may be particularly noticeable when the same audio contented is presented in both listening zones. In some cases, to inhibit such spectral coloring, lower frequencies may be attenuated less than higher frequencies in the attenuated zone, which can help to flatten the acoustic energy in the attenuated zone (i.e., to maintain a substantially balanced spectrum) to provide a user experience that feels more like regular volume control.

Figure 3:
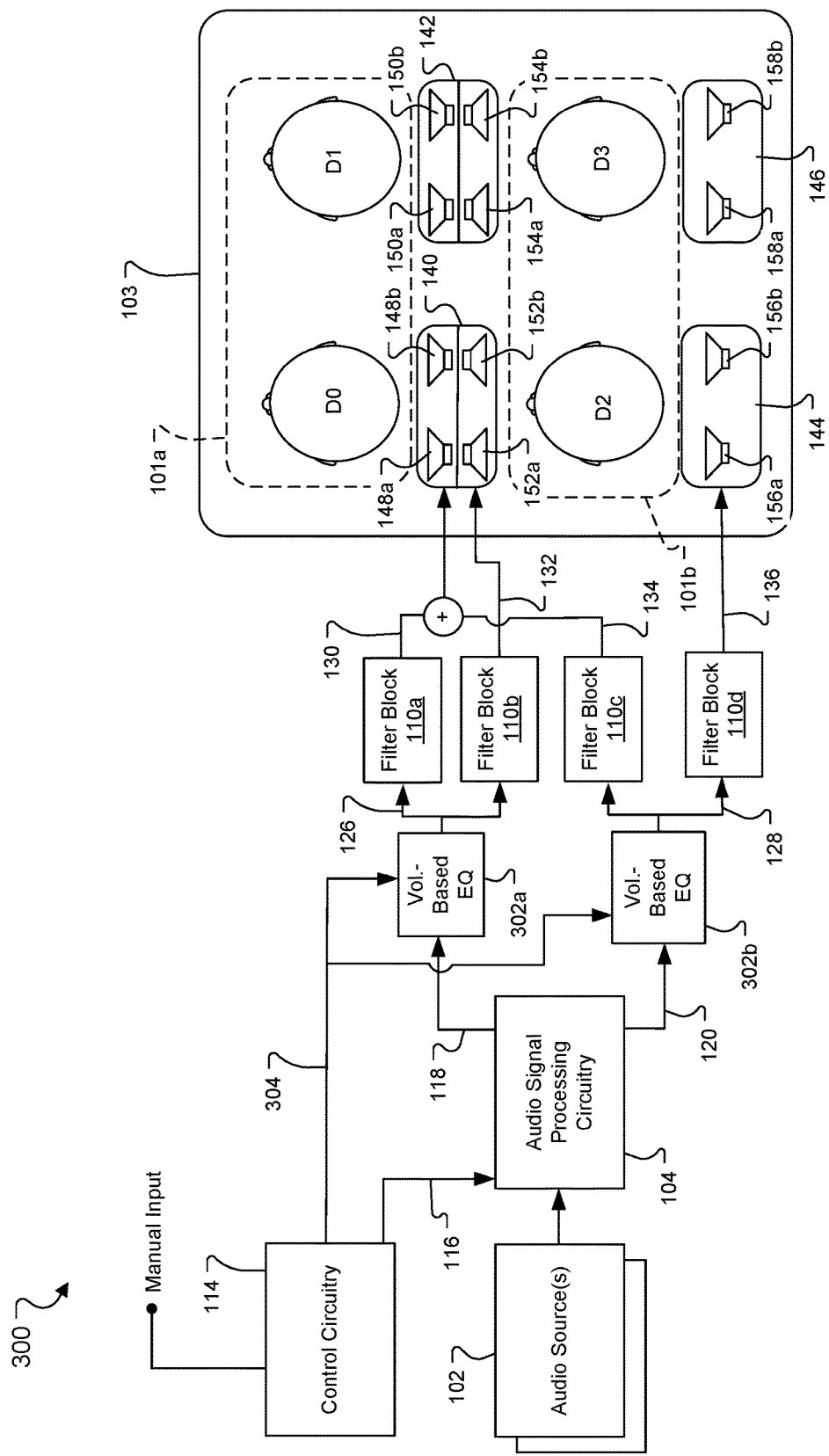
FIG. 3 is a schematic view of a second implementation of a vehicle audio system for providing isolated listening zones in a vehicle cabin.

FIG. 3 illustrates an implementation of the audio system which provides volume-based equalization to account for band-dependent isolation. The system 300 of FIG. 3 includes volume-based equalization circuitry 302a, 302b for the front and rear zones, respectively. The volume-based equalization circuitry 302a, 302b receives a control signal from the control circuitry 114.

In response to volume control information received from a user through manual input, the control circuitry 114 sends a volume control signal 304 to the front and rear volume-based equalization circuitry 302a, 302b, respectively. The volume control signal 304 includes an indication of the respective volume settings for both the front zone 101a and the rear zone 101b. The volume-based equalization circuitry 302a, 302b can then use this information to dynamically adjust equalization to inhibit spectral coloring when the relative volumes of the zones exceeds a predetermined threshold.

Figure 4:
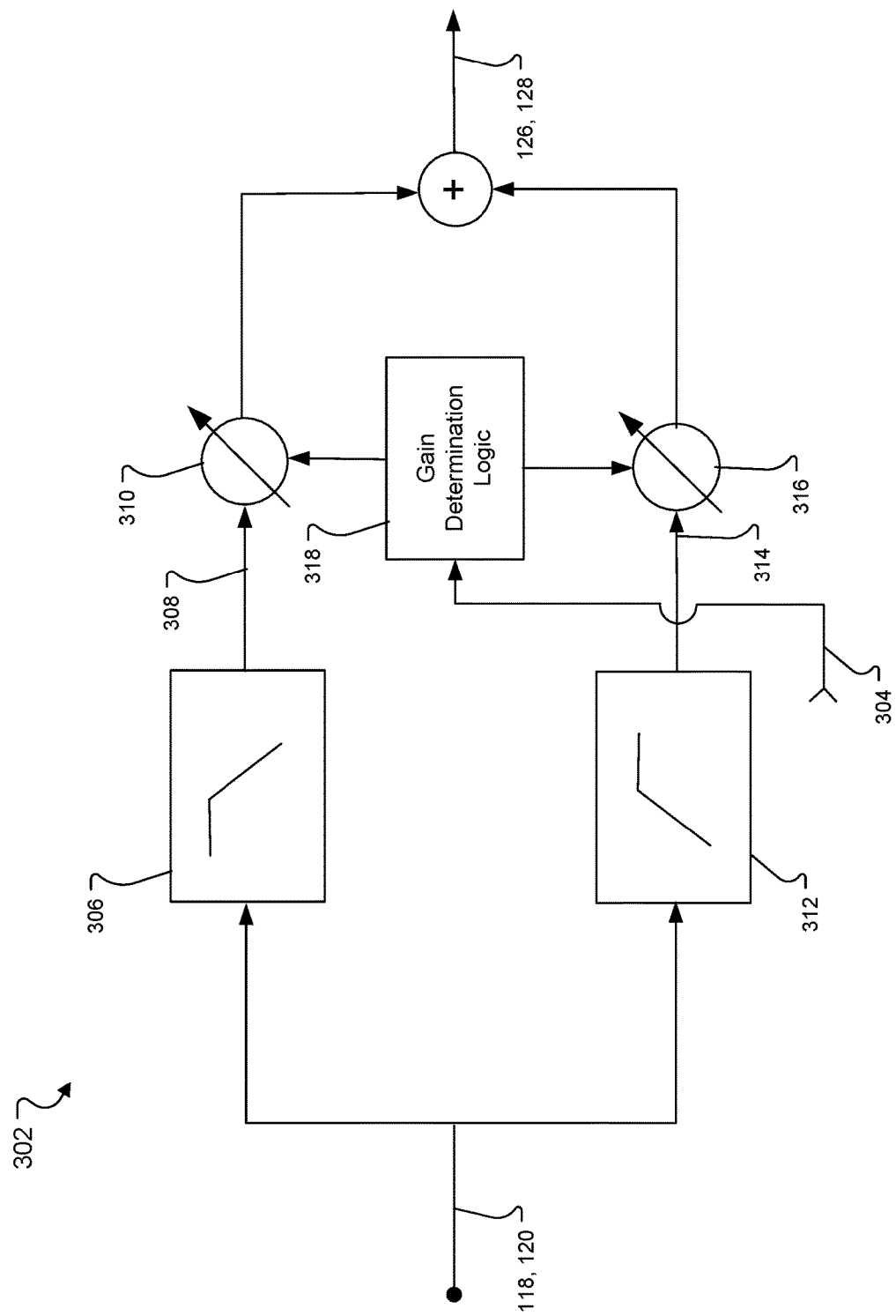
FIG. 4 is a schematic view of volume-based equalization circuitry from the vehicle audio system of FIG. 3.

Referring to FIG. 4, the volume-based equalization circuitry 302a, 302b (collectively referenced as "302") includes a low pass filter 306, which filters high frequency content out of the audio signal 118, 120 and passes a low frequency signal 308 including the low frequency content to a low frequency dynamic gain 310. The volume-based equalization circuitry 302 also include a high pass filter 312 which filters low frequency content out of the audio signal 118, 120 and passes a high frequency signal 314 including the high frequency content to a high frequency dynamic gain 316.

Gain determination logic 318 receives the volume control signal 304 from the control circuitry 114 (FIG. 3) and may adjust the low and/or high frequency dynamic gains 310, 316 accordingly. In particular, the gain determination logic 318 determines the difference in the volume settings between the associated zone (e.g., rear zone 101b) and the other zone (e.g., front zone 101a) and may adjust the respective gains/attenuation applied by the low and high frequency dynamic gains 310, 316 based on the determined difference. In particular, the gain determination logic 318 may adjust the low frequency dynamic gain 310 so as to limit the attenuation of the low frequencies when the determined volume differential exceeds a first predetermined level (e.g., 6 dB).

In some cases, the attenuation of the lower frequencies may be limited to that which is attainable for the higher frequencies. For example, if the determined volume differential is −20 dB, but the system is only expected to provide up to −15 dB attenuation at the higher frequencies due to the leakage of such frequencies from the other zone, then the attenuation of the lower frequencies may be limited to −15 dB.

Figure 5:
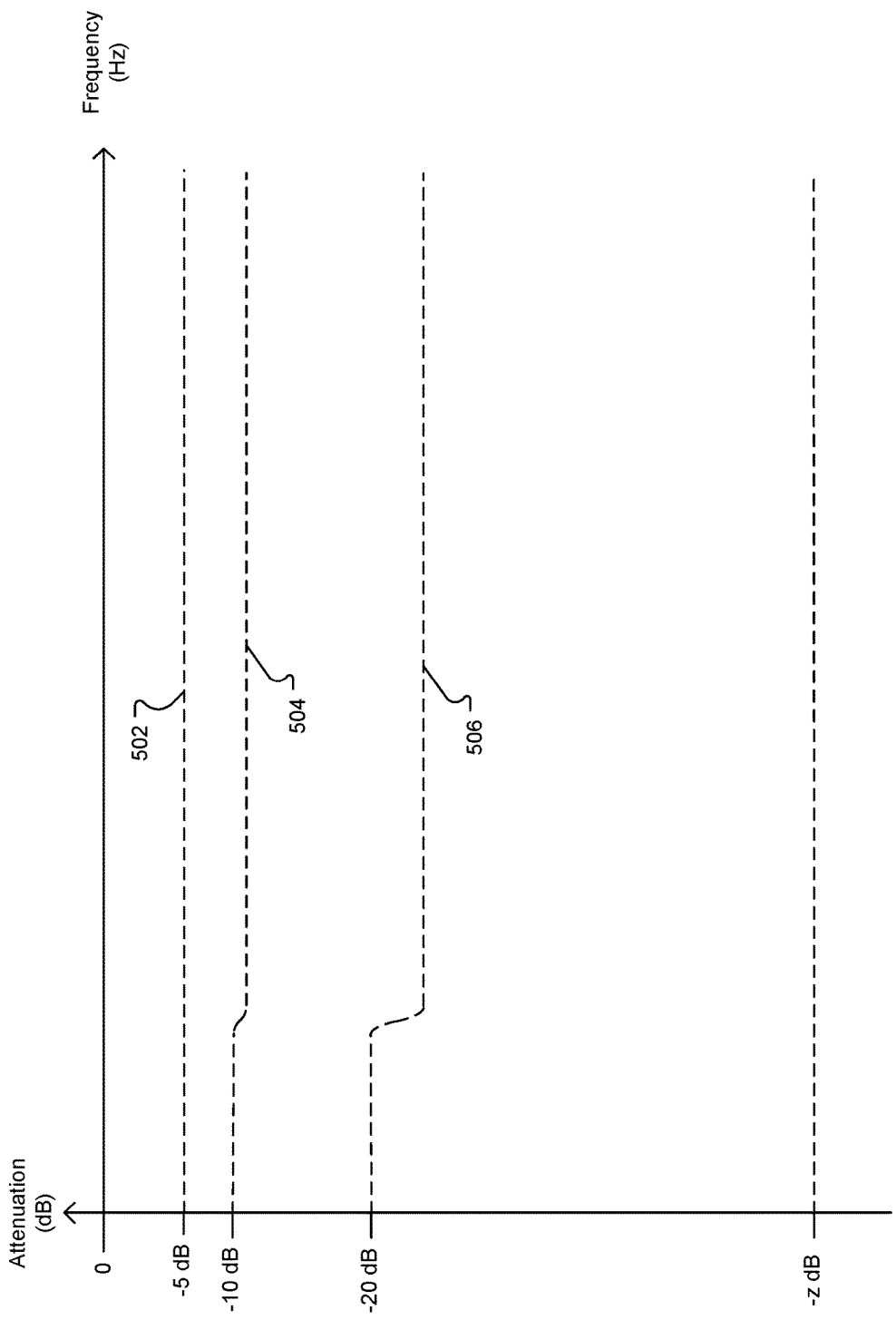
FIG. 5 is graphical representation of attenuation curves that may be applied by the volume-based equalization circuitry of FIG. 4.

FIG. 5 illustrates exemplary attenuation curves that may be employed by the gain determination logic in setting the gain. At −5 dB differential between front and rear zone volume settings the attenuation curve 502 is substantially flat across all frequencies because good cancellation is generally expected in that range. Curve 504 represents a −10 dB differential where the attenuation of the lower frequencies is slightly limited to account for the limited ability of the system to attenuate at the higher frequencies. Curve 506 shows a more pronounced limiting of the attenuation of the lower frequencies at a −20 dB volume setting differential.

In some cases, the attenuation limiting may be turned off when the volume setting differential exceeds a second predetermined value under the assumption that the user is more interested in maximum attenuation than maintaining a balanced spectrum.

Since the attenuation limiting is most beneficial when the two zones are reproducing the same audio content, the system may restrict application of the attenuation limiting to situations in which both the zones are providing the same audio content.

Figure 6:
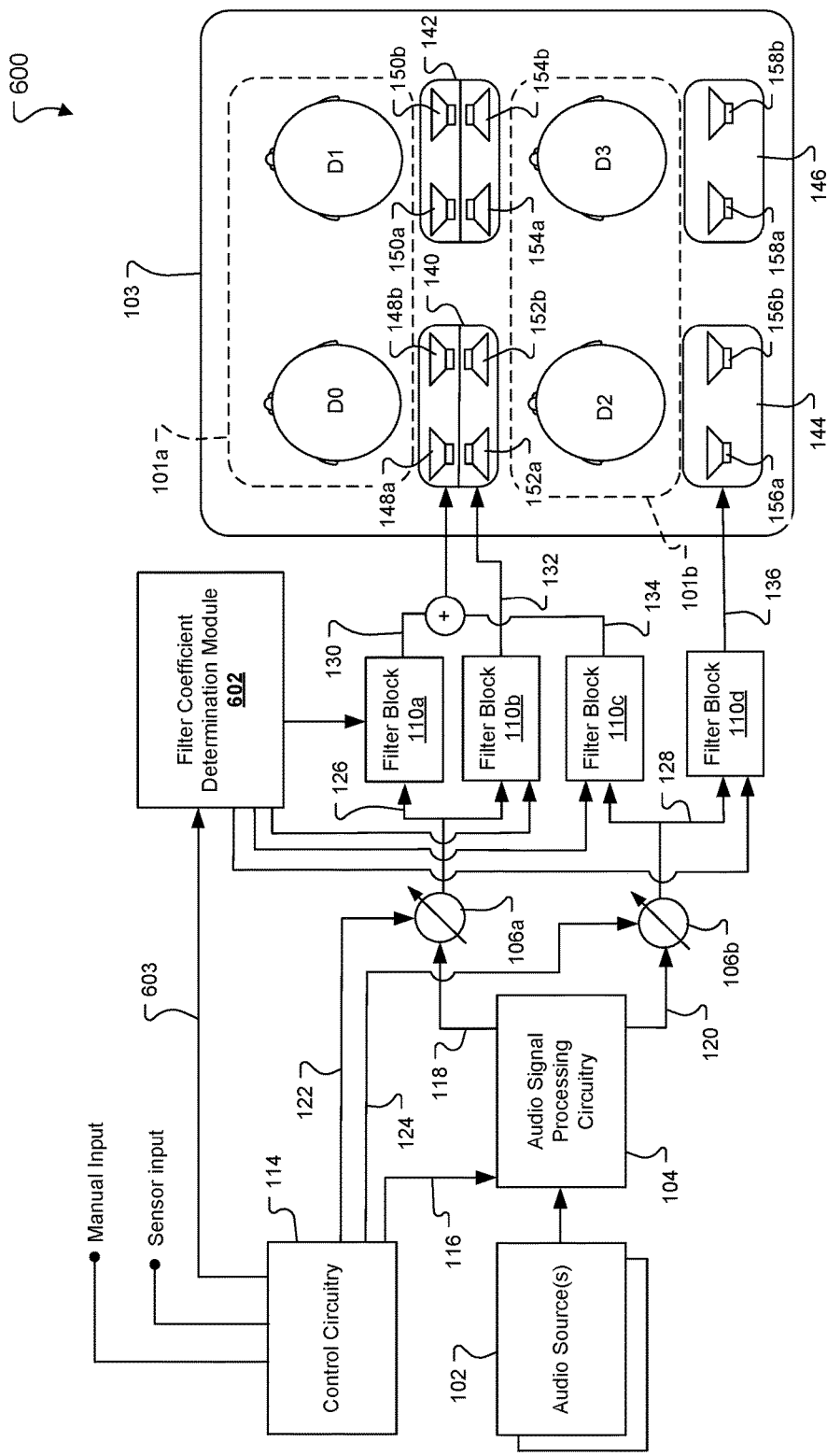
FIG. 6 is a schematic view of a third implementation of a vehicle audio system for providing isolated listening zones in a vehicle cabin.

The acoustic transfer functions within the vehicle cabin 103 (FIGS. 1 & 3) can change with vehicle occupancy. In some cases, the system may be configured to use input indicative of vehicle occupancy to dynamically adjust the coefficients of the filters thereby to take into account the change in the acoustic transfer functions. For example, FIG. 6 illustrates an implementation of a vehicle audio system 600 which includes a filter coefficient determination module 602 which utilizes input 603 indicative of the vehicle occupancy to set the coefficients of the filters. These coefficients may be predetermined based on transfer function measurements taken with varying occupancy configurations. The coefficients for the different occupancy configurations may be stored in a look-up table accessible to the coefficient determination module 602.

The input 603 indicative of vehicle occupancy may be obtained from sensors in the individual seats which detect the presence of a passenger. In some cases, this information may be obtained from the vehicle controller area network (CAN) bus. The sensor input may be obtained via the control circuitry 114 and relayed to the filter coefficient determination module 602, as illustrated in FIG. 6.

Figure 7:
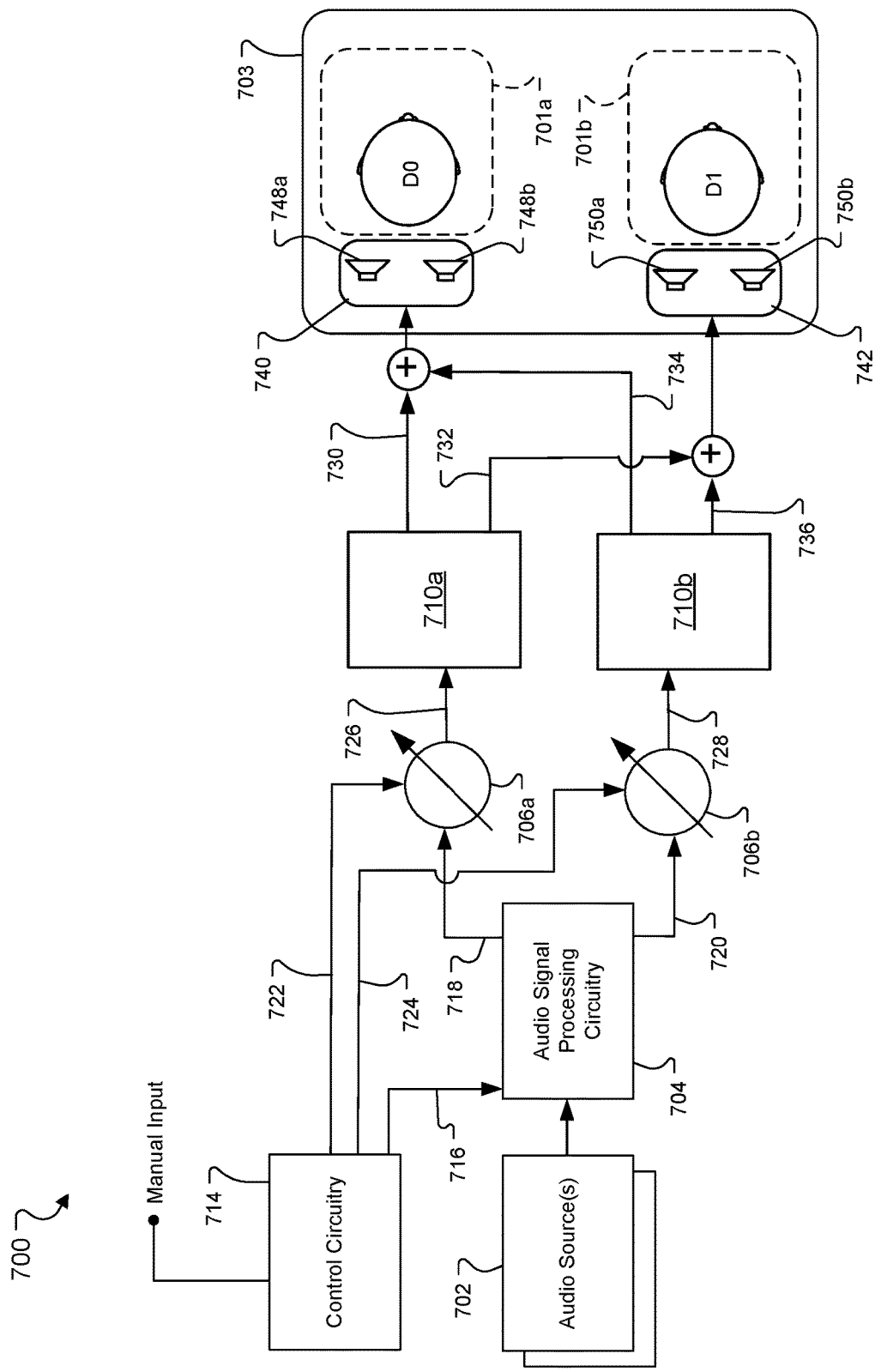
FIG. 7 is a schematic view of a fourth implementation of a vehicle audio system for providing isolated listening zones in a vehicle cabin.

While various concepts have been described above with particular reference to a two zone configuration with the zones arranged one in front of the other, the concepts also be applicable to other configurations. For example, FIG. 7 illustrates an implementation of a vehicle audio system 700 in which separate listening zones (i.e., left and right listening zones 701a, 701b) are provided for two side-by-side seating locations within a vehicle cabin 703.

The system includes one or more audio sources 702 which are coupled to audio signal processing circuitry 704. The audio signal processing circuitry 704 is coupled to left and right volume adjustment circuitry 706a, 706b, respectively. The left and right volume adjustment circuitry 706a, 706b is coupled to headrest mounted speakers via cross-talk cancellation filter blocks 710a, 710b.

In response to control information received from a user through manual input, control circuitry 714 sends a signal 716 to the audio signal processing circuitry 704 selecting a given audio source 702 for the left and right listening zones 701a, 701b. That is, the signal identifies which audio source 702 is selected for each of the listening zones 701a, 701b. Each listening zone 701a, 701b can select a different audio source, or a common audio source may be selected for both of the left (driver) and right (passenger) listening zones 701a, 701b.

The audio signal processing circuitry 704 delivers a first audio signal 718 representing audio content for the left zone 701a to left volume adjustment circuitry 706a, and delivers a second audio signal 720 representing audio content for the right zone 701b to right volume adjustment circuitry 706b.

In response to volume control information received from a user through manual input, the control circuit sends first and second volume control signals 722, 724 to the left and right volume adjustment circuitry 706a, 706b, respectively. The left and right volume adjustment circuitry 706a, 706b adjust the respective amplitudes of the audio signals 718, 720 in response to the volume control signals 722, 724 and provide first and second amplitude adjusted audio signals 726, 728 to the cross-talk cancellation filter blocks 710a, 710b, respectively. In that regard, the left volume adjustment circuitry 706a controls volume of audio content presented in the left listening zone 701a, and the right volume adjustment circuitry 706b operates to control the volume of audio content presented in the right listening zone 701b. Consequently, even when the same audio content is selected for presentation in both zones, the volume level may still differ between the zones.

In the illustrated example, the left volume adjustment circuitry 706a provides a first amplitude adjusted audio signal 726 to the first cross-talk cancellation filter block 710a, and the right volume adjustment circuitry 706b provides a second amplitude adjusted audio signal 728 to the second cross-talk cancellation filter block 710b.

Figure 8A:
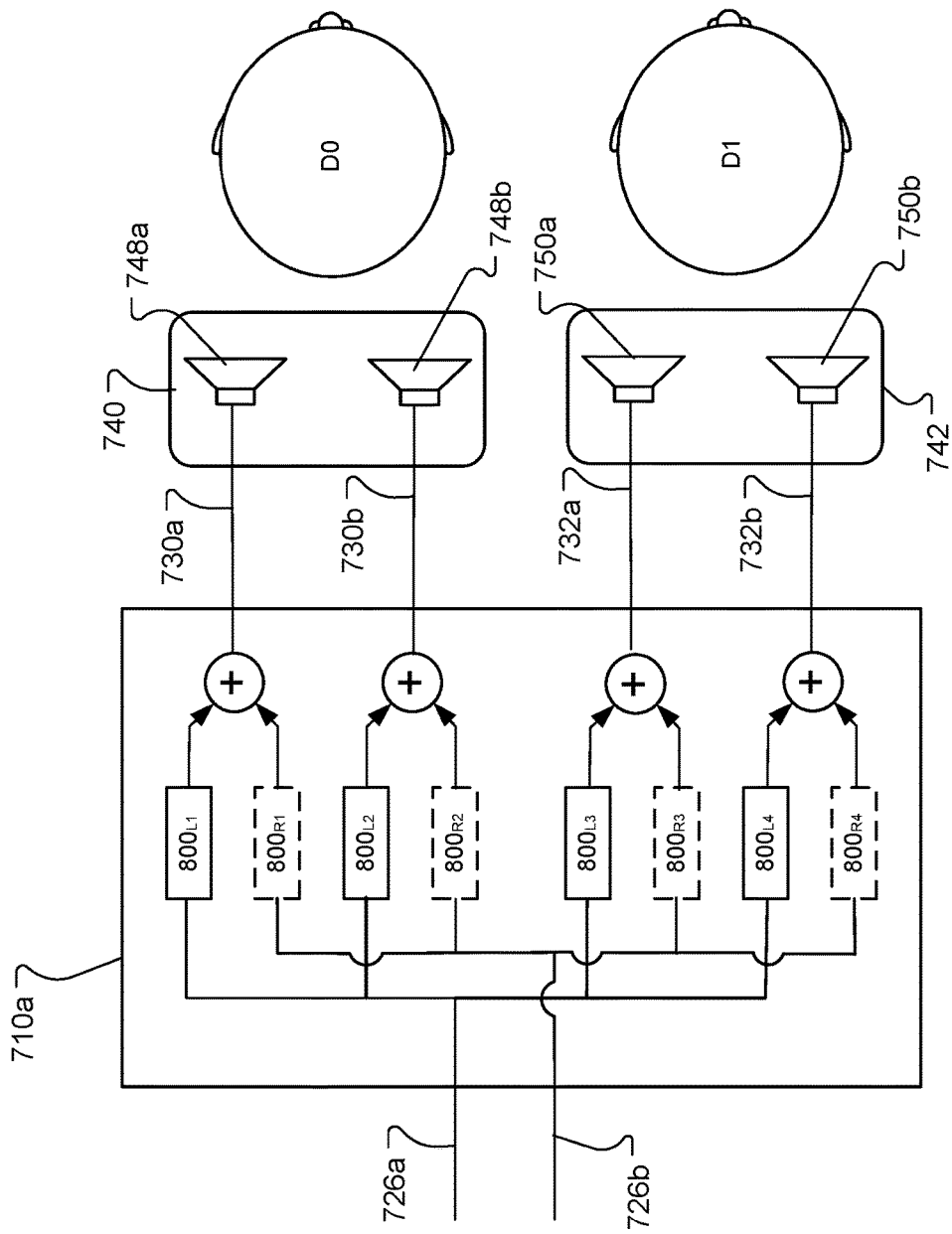
FIGS. 8A and 8B are schematic views of cross-talk cancellation filter blocks and associated headrest mounted speakers from the vehicle audio system of FIG. 7.

Referring to FIG. 8A, the first cross-talk cancellation filter block 710a includes a plurality of cross-talk cancellation filters (eight shown). The first amplitude adjusted audio signal 726, shown as a stereo audio signal consisting of left and right audio channels 726a, 726b, is passed through the first cross-talk cancellation filter block 710a to produce first filtered audio signals 730a, 730b, 732a, 732b, one for each of the headrest mounted speakers. These filtered audio signals determine the net acoustic energy associated with each acoustic channel in the first audio signal 718 that is provided to the occupants D0, D1 in the seats.

A left channel filter $800_{L1}$ associated with a left speaker 748a of the driver's headrest 740 modifies the left channel input signal 726a taking into account the acoustic transfer functions from each of the other headrest mounted speakers 748b, 750a, 750b to an expected position of the driver's left ear to produce a first output signal component that is configured to reproduce the left channel acoustic content of the first audio signal 718 at the driver's left ear.

A right channel filter $800_{R1}$ associated with the left speaker 748a of the driver's headrest 740 modifies the right channel input 726b from the first amplitude adjusted audio signal 726 taking into account the acoustic transfer functions from each of the other headrest mounted speakers 748b, 750a, 750b to the expected position of the driver's left ear to produce a second output signal component that is configured to cancel the right channel acoustic content of the first audio signal 718 that is leaked to the driver's left ear from the other speakers 748b, 750a, 750b in the headrests 740, 742.

The first and second output signal components are combined to produce a filtered audio signal 730a which is provided to the left speaker 748a in the driver's headrest 740. The remaining cross-talk cancellation filters of the first cross-talk cancellation filter block 710a and the associated speakers 748b, 750a, 750b operate similarly so that the occupant in the driver's seat hears only left audio content of the first audio signal 718 at his/her left ear and hears only right audio content of the first audio signal 718 at his/her right ear.

Filters $800_{L2}$ and $800_{R2}$ provide a filtered audio signal 730b to the right speaker 748b in the driver's headrest 740, which is transduced to reproduce the right channel acoustic content of the first audio signal 718 at the driver's right ear, while cancelling left channel content of the first audio signal 718 leaked by the other headrest mounted speakers 748a, 750a, 750b at the driver's right ear.

Filters $800_{L3}$ and $800_{R3}$ provide a filtered audio signal 732a to the left speaker 750a in the passenger's headrest 742, which is transduced to cancel left and right channel content of the first audio signal 718 leaked by the other headrest mounted speakers 748a, 748b, 750b at the passenger's left ear.

Filters $800_{L4}$ and $800_{R4}$ provide a filtered audio signal 732b to the right speaker 750b in the passenger's headrest 742, which is transduced to cancel the left and right channel content of the first audio signal 718 leaked by the other headrest mounted speakers 748a, 748b, 750a at the passenger's right ear.

Figure 8B:
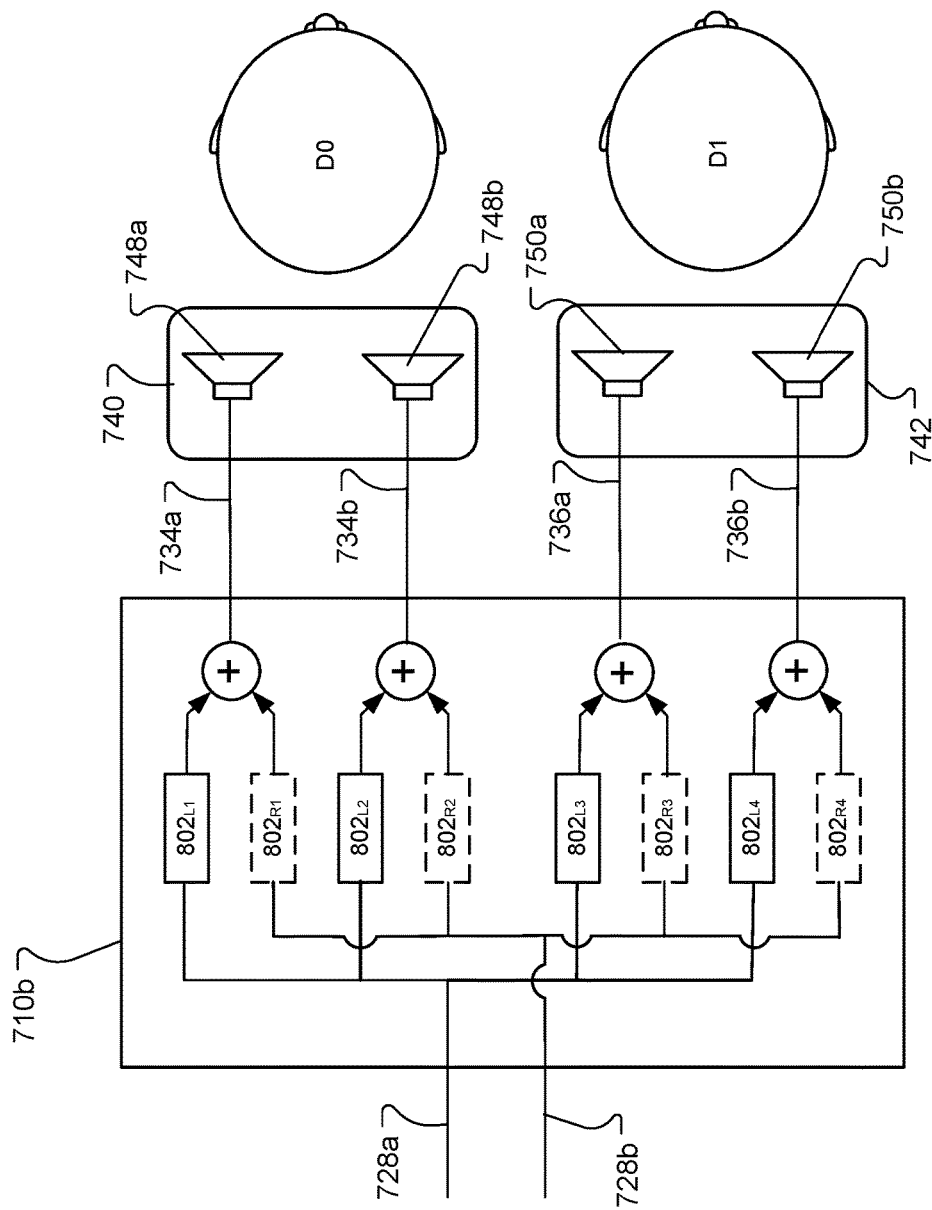

Referring to FIG. 8B, the second cross-talk cancellation filter block 710b includes a plurality of cross-talk cancellation filters (eight shown). The second amplitude adjusted audio signal 728, shown as a stereo audio signal consisting of left and right audio channels 728a, 728b, is passed through the second cross-talk cancellation filter block 710b to produce second filtered audio signals 734a, 734b, 736a, 736b, one for each of the headrest mounted speakers 748a, 748b, 750a, 750b. These filtered audio signals 734a, 734b, 736a, 736b determine the net acoustic energy associated with each acoustic channel in the second audio signal 720 that is provided to the seat occupants D0, D1.

A left channel filter $802L_1$ associated with the left speaker 748a of the driver's headrest 740 modifies the left channel input signal 728a taking into account the acoustic transfer functions from each of the other headrest mounted speakers 748b, 750a, 750b to an expected position of the driver's left ear to produce a first output signal component that is configured to cancel the left channel acoustic content of the second audio signal 720 that is leaked to the driver's left ear from the other headrest mounted speakers 748b, 750a, 750b.

A right channel filter $802R_1$ associated with the driver's headrest 740 modifies the right channel input signal 728b from the second amplitude adjusted audio signal 728 taking into account the acoustic transfer functions from each of the other front headrest mounted speakers 748b, 750a, 750b to the expected position of the rear left passenger's left ear to produce a second output signal component that is configured to cancel the right channel acoustic content of the second audio signal 720 that is leaked to the driver's left ear from the other front headrest mounted speakers 748b, 750a, 7540b. The first and second output signal components are combined to produce a filtered audio signal 734a, which is provided to the left speaker 748a in the driver's headrest 740.

Filters $802_{L2}$ and $802_{R2}$ provide a filtered audio signal 734b to the right speaker 748b in the driver's headrest 740, which is transduced to cancel audio content of the second audio signal 720 leaked by the other headrest mounted speakers 748a, 750a, 750b at the driver's right ear.

Filters $802_{L3}$ and $803_{R3}$ provide a filtered audio signal 736a to the left speaker 750a in the passenger's headrest 742, which is transduced to reproduce the left channel acoustic content of the second audio signal 720 at the passenger's left ear, while cancelling right channel content of the second audio signal 720 leaked by the other headrest mounted speakers 748a, 748b, 750b at the passenger's left ear.

Filters $802_{L4}$ and $802_{R4}$ provide a filtered audio signal 736b to the right speaker 750b in the passenger's headrest 742, which is transduced to reproduce the right channel acoustic content of the second audio signal 720 at the passenger's right ear, while cancelling left channel content of the second audio signal 720 leaked by the other headrest mounted speakers 748a, 748b, 750a at the passenger's right ear.

Figure 9:
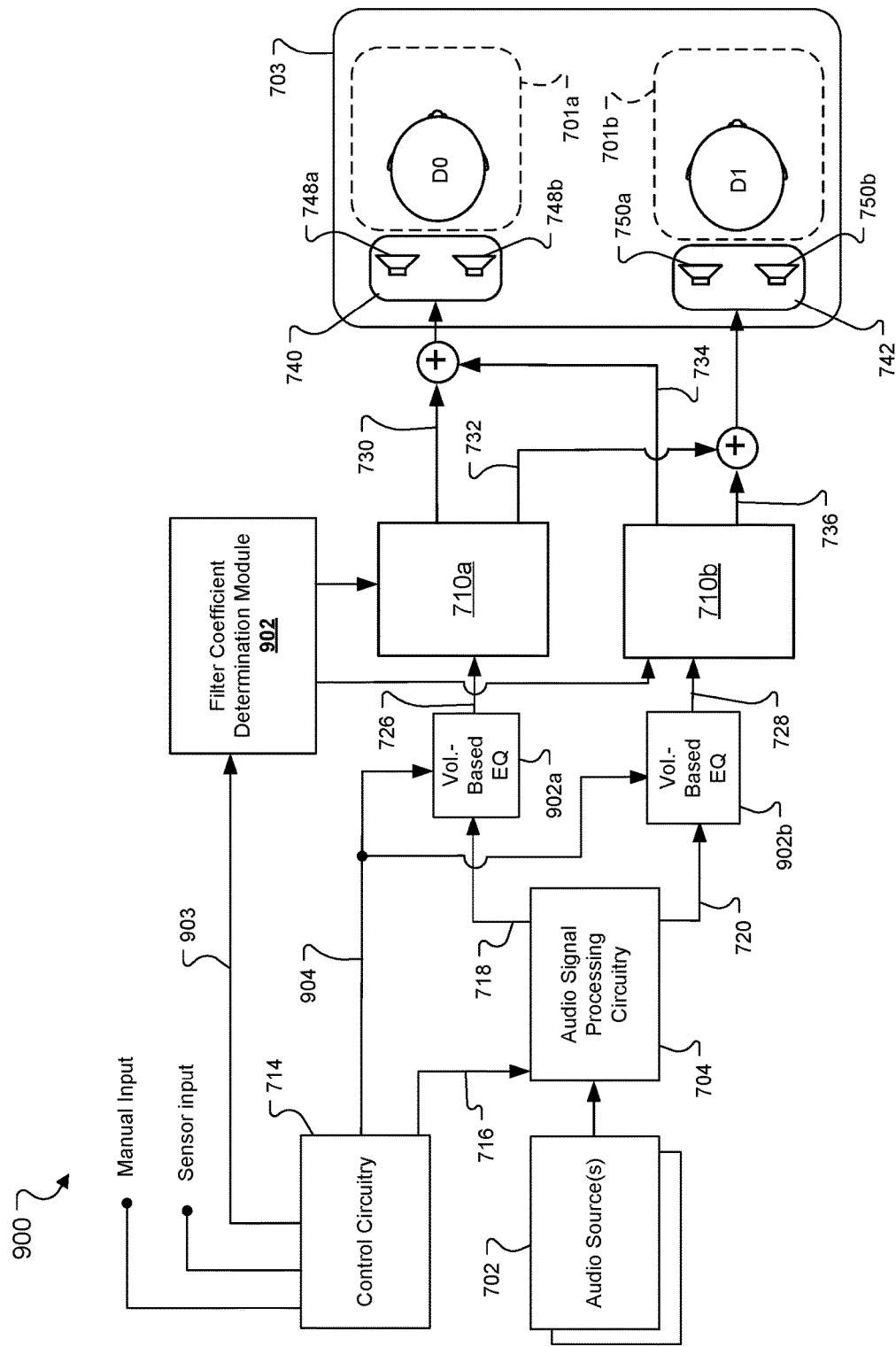
FIG. 9 is a schematic view of a fifth implementation of a vehicle audio system for providing isolated listening zones in a vehicle cabin.

FIG. 9 illustrates an implementation of a vehicle audio system 900 with side-by-side listening zones 701a, 70b which includes volume-based equalization circuitry 902a, 902b for limiting attenuation of low frequencies when the volume differential in the two listening zones 701a, 701b exceeds a first predetermined value. The volume-based equalization circuitry may operate in a similar manner to that discussed above with reference to FIGS. 3 & 4.

FIG. 9 also shows an optional filter coefficient determination module 902 which may utilize input 903 indicative of the vehicle occupancy to set the coefficients of the filters. These coefficients may be predetermined based on acoustic transfer function measurements taken with varying occupancy configurations. The coefficients for the different occupancy configurations may be stored in a look-up table accessible to the coefficient determination module 902.

Figure 10:
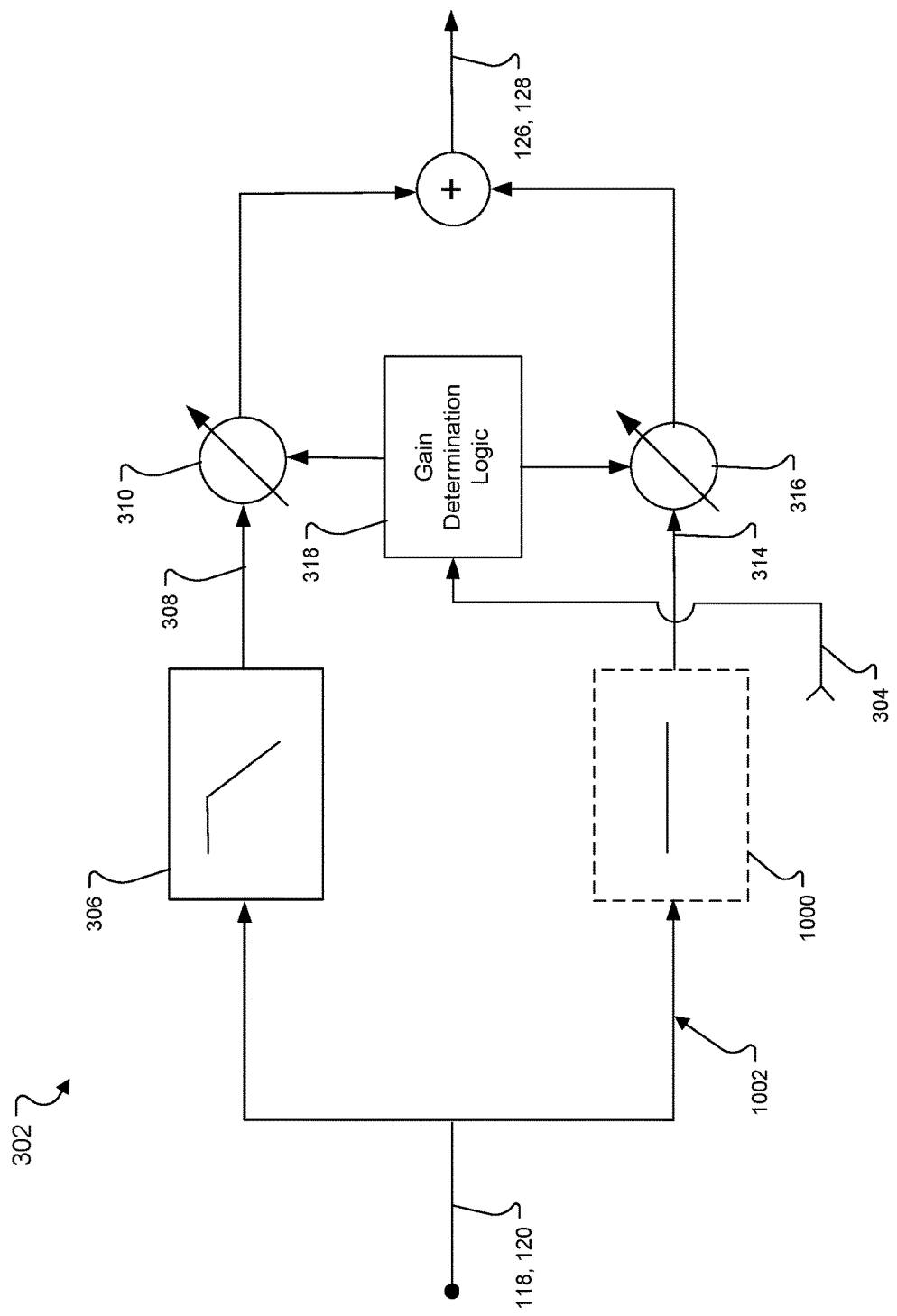
FIG. 10 is a schematic view of a second implementation of volume-based equalization circuitry.

Although a few implementations have been described in detail above, other modifications are possible. While a particular example of volume-based equalization circuitry was described above with respect to FIG. 4, FIG. 10 illustrates another implementation that uses one path with the low pass filter (306), but instead of a high pass filter on the other path, another type of filter 1000 may be provided. In some cases, the other filter 1000 may be an all pass filter. For example, the low pass filter 306, which has non-zero phase, may cancel at certain frequencies with the second gain path 1002, which in this example is a broadband gain path. Adding an all pass filter to the second gain path 1002 can help to match the phase of the low pass filter 306 to help avoid the unintended cancellation. Alternatively or additionally, other filters types may be applied along the second gain path 1002, or along additional gain paths (not shown), so that the entire frequency spectrum is adjustable.

Alternatively or additionally, in some cases, just a straight gain (no filter) is provided along one of the signal paths. Such an implementation may also be designed to provide the results shown in FIG. 5.

Furthermore, although the foregoing description focused on the application of attenuation limiting to low frequencies because those are the most obvious spectral flaw when one zone is attenuated, in some cases, this mechanism may alternatively or additionally be utilized to smooth out mid- and/or high-frequencies.

In addition, as an alternative or in addition to limiting attenuation of a frequency portion within the attenuated zone, the amplification of frequencies in one or more frequency portions (e.g., mid- and/or high-frequency portions) of the audio signal 118, 120 (FIG. 3) may be limited in the amplified zone, thereby to limit bleed/leakage of those frequencies into the attenuated zone. For example, referring back to FIG. 4, the gain determination logic 318 may adjust the high frequency dynamic gain 316 so as to limit the amplification of frequencies in a high frequency portion of the audio signal 118, 120, when the determined volume differential exceeds a first predetermined level (e.g., 6 dB).

Other near-field speaker configurations are possible. For example, the speakers may also be mounted on visors or in a vehicle headliner proximal to seating locations.

A number of implementations have been described. Nevertheless, it will be understood that additional modifications may be made without departing from the scope of the inventive concepts described herein, and, accordingly, other implementations are within the scope of the following claims.

What is claimed is:

1. An audio system comprising:
   a plurality of near-field speakers arranged in a listening area;
   a plurality of cross-talk cancellation filters coupled to the near-field speakers, the near-field speakers and the cross-talk cancellation filters being arranged to provide first and second listening zones in the listening area in which audio from the first listening zone is cancelled in the second listening zone and vice versa;
   a plurality of sensors for detecting occupancy within the listening area; and
   a filter coefficient determination module configured to select filter coefficients for the cross-talk cancellation filters based on input indicative of the occupancy obtained via the plurality of sensors.

2. The audio system of claim 1, further comprising a look-up table storing the filter coefficients, wherein the filter coefficient determination module selects the filter coefficients from the look-up table.

3. An audio system comprising:
   a plurality of near-field speakers comprising:
      a first set of near-field speakers,
      a second set of near-field speakers, and
      a third set of near-field speakers; and
   a plurality of cross-talk cancellation filter blocks comprising:
      a first cross-talk cancellation filter block comprising a first plurality of cross-talk cancellation filters for filtering a first audio signal to provide first filtered audio signals which are transduced by the first set of near-field speakers to present audio content of the first audio signal at one or more seating locations in a first listening area and to provide inter-aural cross-talk cancellation of left channel and right channel audio content of the first audio signal at the one or more seating locations in the first listening area,
      a second cross-talk cancellation filter block comprising a second plurality of cross-talk cancellation filters for filtering the first audio signal to provide second filtered audio signals which are transduced by the second set of near-field speakers to cancel audio content of the first audio signal at one or more seating locations in a second listening area,
      a third cross-talk cancellation filter block comprising a third plurality of cross-talk cancellation filters for filtering a second audio signal to provide third filtered audio signals which are transduced by the first set of near-field speakers to cancel audio content of the second audio signal at the one or more seating locations in the first listening area, and
      a fourth cross-talk cancellation filter block comprising a fourth plurality of cross-talk cancellation filters for filtering the second audio signal to provide fourth filtered audio signals which are transduced by the third set of near-field speakers to present audio content of the second audio signal at the one or more seating locations in the second listening area and to provide inter-aural cross-talk cancellation of left channel and right channel audio content of the second audio signal at the one or more seating locations in the second listening area.

4. The audio system of claim 3,
   wherein the first set of near-field speakers are mounted in one or more headrests in a first row of seats in the listening area,
   wherein the second set of near-field speakers are mounted in the one or more headrests in the first row of seats,
   wherein the third set of near-field speakers are mounted in one or more headrests in a second row of seats positioned behind the first row of seats in the listening area,
   wherein the one or more seating locations in the first listening area are in the first row of seats, and,
   wherein the one or more seating locations in the second listening area are in the second row of seats.

5. The audio system of claim 3, further comprising:
   a plurality of sensors for detecting occupancy within the first and the second listening areas; and
   a filter coefficient determination module configured to select filter coefficients for the cross-talk cancellation filters based on input indicative of the occupancy obtained via the plurality of sensors.

6. The audio system of claim 5, further comprising:
   a look-up table storing the filter coefficients, wherein the filter coefficient determination module selects the filter coefficients from the look-up table.

* * * * *